(12) United States Patent
Chen et al.

(10) Patent No.: US 10,916,829 B2
(45) Date of Patent: Feb. 9, 2021

(54) SEMICONDUCTOR PACKAGE STRUCTURE HAVING ANTENNA MODULE

(71) Applicant: SJ Semiconductor (Jiangyin) Corporation, Jiangyin (CN)

(72) Inventors: Yenheng Chen, Jiangyin (CN); Chengtar Wu, Jiangyin (CN); Chengchung Lin, Jiangyin (CN)

(73) Assignee: SJ Semiconductor (Jiangyin) Corporation, Jiangyin (CN)

( * ) Notice: Subject to any disclaimer, the term of this patent is extended or adjusted under 35 U.S.C. 154(b) by 0 days.

(21) Appl. No.: 16/233,021

(22) Filed: Dec. 26, 2018

(65) Prior Publication Data

US 2019/0198972 A1 Jun. 27, 2019

(30) Foreign Application Priority Data

Dec. 27, 2017 (CN) .......................... 2017 2 18556711

(51) Int. Cl.
| | | |
|---|---|---|
| *H01L 23/48* | (2006.01) | |
| *H01L 23/52* | (2006.01) | |
| *H01L 29/40* | (2006.01) | |
| *H01Q 1/22* | (2006.01) | |
| *H01L 23/29* | (2006.01) | |
| *H01L 23/538* | (2006.01) | |
| *H01L 23/00* | (2006.01) | |
| *H01L 23/498* | (2006.01) | |
| *H01L 23/66* | (2006.01) | |

(Continued)

(52) U.S. Cl.
CPC ......... *H01Q 1/2283* (2013.01); *H01L 23/293* (2013.01); *H01L 23/3128* (2013.01); *H01L 23/49811* (2013.01); *H01L 23/5384* (2013.01); *H01L 23/562* (2013.01); *H01L 23/66* (2013.01); *H01L 24/14* (2013.01); *H01Q 1/36* (2013.01); *H01L 2223/6677* (2013.01); *H01L 2224/16227* (2013.01); *H01L 2924/15321* (2013.01); *H01L 2924/18161* (2013.01); *H01L 2924/3511* (2013.01)

(58) Field of Classification Search
CPC .............. H01L 23/293; H01L 23/3128; H01L 23/49811; H01L 23/5384; H01L 23/562; H01L 23/66; H01L 24/14; H01L 23/043; H01L 23/488; H01L 23/28; H01L 23/49838; H01L 21/56; H01L 2225/06513; H01L 2225/06517; H01L 31/0203; H01L 31/048; H01L 33/52
USPC .......................... 257/690, 778, 782, 786, 787
See application file for complete search history.

(56) References Cited

U.S. PATENT DOCUMENTS

| | | | | |
|---|---|---|---|---|
| 2009/0146281 A1* | 6/2009 | Jung | ................. | H01L 23/49816 257/678 |
| 2014/0225276 A1* | 8/2014 | Ho | ......................... | H01L 23/481 257/774 |
| 2017/0048981 A1* | 2/2017 | Hu | ......................... | H01L 25/117 |

* cited by examiner

*Primary Examiner* — Kimberly N Rizkallah
*Assistant Examiner* — Dilinh P Nguyen
(74) *Attorney, Agent, or Firm* — Alston & Bird LLP

(57) ABSTRACT

A semiconductor package structure having an antenna module includes: a substrate, having at least one via hole running through the substrate; a rewiring layer, disposed on a surface of the substrate; a metal bump, disposed on and electrically connected to the rewiring layer; a semiconductor chip, disposed on and electrically connected to the rewiring layer; a conductive column, filling the via hole; a plastic packaging material layer, surrounding the metal bump and the semiconductor chip; and an antenna module, electrically connected to the metal bump through the conductive column and the rewiring layer.

9 Claims, 5 Drawing Sheets

(51) Int. Cl.
*H01L 23/31* (2006.01)
*H01Q 1/36* (2006.01)

SEMICONDUCTOR PACKAGE STRUCTURE HAVING ANTENNA MODULE

CROSS REFERENCES TO RELATED APPLICATIONS

This application claims the benefit of priority to Chinese Patent Application No. CN2017218556711, entitled "Semiconductor Packaging Structure Having Antenna Module", filed with SIPO on Dec. 27, 2017, the contents of which are incorporated herein by reference in its entirety.

TECHNICAL FIELD

The present disclosure relates to the field of semiconductor packaging, and in particular, to a semiconductor package structure having an antenna module.

BACKGROUND

Because of increased functions, performance, integration level of integrated circuits, and the emergence of new types of integrated circuits, packaging technology has been playing an increasingly important role in integrated circuit products, and has amounted to a higher proportion in the value of the entire electronic systems. At the same time, with the critical dimension of integrated circuits reaching a nanometer level, transistors are moving towards higher densities and higher clock frequencies, therefore packaging sizes are shrinking as well.

Fan-out wafer level packaging (FOWLP) technology has the advantages of miniaturization, low cost and high integration level, as well as better performance and higher energy efficiency. It has become an important packaging method for electronic devices in highly-demanding mobile/wireless networks. It is one of the most promising packaging technologies at the present time. In addition, for better communication effect, radio frequency chips are always provided with antennas in use. However, most of the existing radio frequency antennas are laid out directly on printed circuit board or PCB. Radio frequency function modules or interfaces for external antennas are reserved during layout design. The antenna gain is achieved at the expense of PCB area. In addition, it is difficult to control chip warpage of FOWLP by adopting processes such as plastic packaging, when it is difficult to alleviate the warpage. In addition, it is also difficult to control material shrinkage or swelling causes slippage and misalignment in the packaging process. Plus the heat conductivity is poor leading to overheating problem. In addition, the preparation process and component selection choices may not be optimized, therefore bonding strength between the components may not be strong enough to hold them together for lifetime.

Therefore, it is necessary to have a low warpage, strong bonding, low heating, and low-cost semiconductor packaging structure having antennas.

SUMMARY

The present disclosure provides a semiconductor package structure having an antenna module. The semiconductor package structure comprises: a substrate, having a first surface and a second surface opposite to the first surface, wherein at least one via hole is formed through the substrate from the first surface to the second surface; a rewiring layer, disposed on the first surface of the substrate; a metal bump, disposed on and electrically connected to the rewiring layer; a semiconductor chip, disposed on and electrically connected to the rewiring layer, where a space is arranged between the semiconductor chip and the metal bump; a conductive column, filling the via hole; a plastic packaging material layer, disposed on the rewiring layer, embedding the metal bump and the semiconductor chip except leaving a top part of the metal bump and a top part of the semiconductor chip exposed; and an antenna module, disposed on the second surface of the substrate, where the antenna module is electrically connected to the metal bump through the conductive column and the rewiring layer.

In a preferred solution of the present disclosure, the plastic packaging material layer comprises one of a polyimide layer, a silica gel layer and an epoxy resin layer.

In a preferred solution of the present disclosure, the substrate comprises a quartz glass substrate or a sapphire substrate.

In a preferred solution of the present disclosure, the rewiring layer comprises: a dielectric layer, bonded onto the first surface of the substrate; one metal wire layer, where the metal wire layer is patterned inside the dielectric layer; and an under-bump metal layer, patterned on the dielectric layer to be electrically connect to the metal wire layer, where the metal bump is disposed on the under-bump metal layer.

In a preferred solution of the present disclosure, the metal bump comprises: a copper column, a nickel layer disposed on a top surface of the copper column and a solder bump disposed on the nickel layer.

In a preferred solution of the present disclosure, the antenna module comprises a plurality of antenna units, each having the antenna units have a same shape, and each is arranged to have a spacing space from another antenna unit of the plurality of antenna units.

In a preferred solution of the present disclosure, the plurality of antenna units each comprises a central portion and a peripheral portion surrounding the central portion, and a gap is arranged between the peripheral portion and the central portion, where the central portion is electrically connected to the metal bump through the conductive column and the rewiring layer.

In a preferred solution of the present disclosure, an outer edge circumvent of the central portion has is a circle shape, an outer edge circumvent of the peripheral portion has is a square shape, and an edge inner circumvent of the peripheral portion close to a side of the central portion has is a circle.

In a preferred solution of the present disclosure, the plurality of antenna units is arranged on the second surface of the substrate in an array, or along a ring, or in unevenly spaced pattern.

In a preferred solution of the present disclosure, the antenna module comprises at least two layers of antenna module units, and each layer of the antenna module units comprises at least one antenna unit.

DESCRIPTIONS OF REFERENCE NUMERALS

Figure 1:
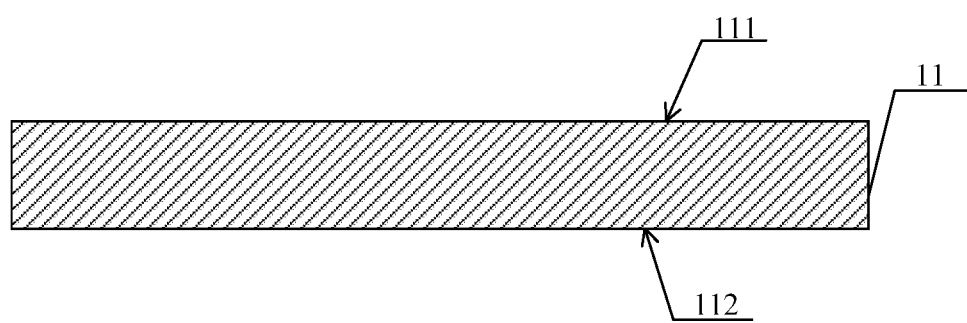
FIG. 1 is a substrate of a semiconductor package structure according to the present disclosure.

11 Substrate
111 First surface
112 Second surface
21 Rewiring layer
211 Under-bump metal layer
212 Dielectric layer
213 Metal wire layer
31 Metal bump
41 Semiconductor chip
51 Plastic packaging material layer
61 Via hole
71 Conductive column
81 Antenna unit
811 Central portion
812 Peripheral portion
91 Bonding layer
92 Fixing ring

DETAILED DESCRIPTION OF THE PREFERRED EMBODIMENTS

Implementations of the present disclosure are described below by using particular and specific embodiments, and a person skilled in the art can easily understand other advantages and efficacy of the present disclosure from content disclosed in the specification.

It should be known that, structures, proportions, sizes and the like drawn in drawings appended to this specification are all only used to be understood and read by a person skilled in the art in cooperation with content disclosed in the specification, but are not used to limit limitation conditions that the present disclosure may implement, and therefore do not have a technically essential meaning. Any modification in a structure, change in a proportion relationship or adjustment in a size, without affecting the efficacy that the present disclosure can generate and the object that the present disclosure can achieve, should still fall within the scope that the technical content disclosed in the present disclosure can cover. Moreover, terms such as "upper", "lower", "left", "right", "middle" and "a" cited in this specification are also only used to facilitate clear description, but are not used to limit the scope that the present disclosure may implement, and change or adjustment in a relative relationship between the terms, without essentially changing the technical content, should also be considered as the scope that the present disclosure may implement.

As shown in FIG. 1 to FIG. 10, the present disclosure provides a semiconductor package structure having an antenna module. The semiconductor package structure comprises: a substrate 11, having a first surface 111 and a second surface 112 opposite to the first surface, wherein at least one via hole 61 running through the first surface and the second surface is formed in the substrate 11; a rewiring layer 21, disposed on the first surface 111 of the substrate; a metal bump 31, disposed on and electrically connected to the rewiring layer 21; a semiconductor chip 41, disposed on and electrically connected to the rewiring layer 21, wherein a spacing is arranged between the semiconductor chip 41 and the metal bump 31; a conductive column 71, filling the via hole 61, and running through the substrate 11 vertically; a plastic packaging material layer 51, disposed on the rewiring layer 21, wrapping the metal bump 31 and the semiconductor chip 41, and exposing a part of the metal bump 31 and a part of the semiconductor chip 41; and an antenna module, disposed on the second surface 112 of the substrate, where the antenna module is electrically connected to the metal bump 31 sequentially through the conductive column 71 and the rewiring layer 21.

In an example, the substrate 11 may be a quartz glass substrate or a sapphire substrate.

Specifically, the present disclosure provides a semiconductor package structure, wherein the substrate 11 is preferably a quartz substrate or a sapphire substrate. On the one hand, because the quartz plate has no warpage problem, the semiconductor chip can be prevented from being broken, warped and cracked in the subsequent preparation process; and on the other hand, quartz has good heat conductivity, which is ten to hundred times better than that of packaging material, thus the problem of heat effect in the packaging process will be solved. In addition, in other examples, the substrate may also be any other glass substrates, which is not limited herein.

The shape of the substrate 11 may be set according to actual needs, The shape of the substrate 11 may be a rectangle, a circle, a hexagon, a triangle, a trapezoid or the like, and is not limited herein. The via hole 61 is further formed in the substrate 11. In an example, the via hole 61 may be formed in the substrate by using a laser drilling process, or the via hole 61 may be formed in the substrate 11 by using a process such as etching, and a cross-sectional shape of the via hole 61 may be set according to an actual need. Preferably, in this embodiment, the cross-sectional shape of the via hole 61 may be an inverted trapezoid. Certainly, in another example, the shape of the via hole 61 may further be a rectangle or the like.

It should be noted that, when a metal wire layer 213 in the rewiring layer 21 and corresponding to a location of the via hole 61 is not exposed from a surface of a dielectric layer adjacent to the second surface of the substrate 11, after running through the substrate 11, the via hole 61 further extends into the dielectric layer 212 of the rewiring layer 21, so as to ensure that a part of the metal wire layer 213 is exposed from the via hole 61.

Specifically, the semiconductor chip 41 may be any kind of semiconductor function chip, and a connection bonding pad electrically leading out its internal function devices is further formed on a front surface of the semiconductor chip 41. The connection bonding pad is exposed from the front surface of the semiconductor chip. Preferably, a top surface of the connection bonding pad is leveled with a top surface of the semiconductor chip. That a spacing arranged between the semiconductor chip 41 and the metal bump 31 refers to the semiconductor chip is spaced with the metal bump at a position that protrudes out of the metal wiring layer on the metal wiring layer, and insulated from the substrate, i.e., the exposed exterior part is not conducted.

In additional, in the present disclosure, structures such as the antenna module, the rewiring layer, the metal bump and the semiconductor chip are disposed on each side of the two opposite side of the substrate. Therefore, an antenna structure can be properly designed, and the volume of the entire semiconductor package structure can be reduced.

In an example, the plastic packaging material layer 51 comprises any one of a polyimide layer, a silica gel layer and an epoxy resin layer.

Specifically, the semiconductor chip 41 is packaged by the plastic packaging material layer 51 through any one of compression molding, transfer molding, liquid encapsulate molding, vacuum lamination and spin-coating. The plastic packaging material layer 51 embeds the semiconductor chip 41, except exposes electric leading-out side on the top front surface of the semiconductor chip. That is, all other surfaces of the semiconductor chip except the electric leading-out side are in contact with the plastic packaging material layer. On one hand, the stability of the chip in the packaging process can be ensured, on the other hand, the chip will not be easily contaminated and destroyed in the packaging process, there is no need to worry about the bonding strength between the chip and other material layers, the process steps are simple and optimized. In additional, the plastic packaging material layer wraps the periphery of the metal bump, and exposes the part to be connected, thus the packaging stability of the metal bump is further ensured, it is also ensured that only one packaging material (the plastic packaging material layer) is used, no other material layer is involved, it is ensured that there is no relative displacement between the plastic packaging material layer and the metal bump, and the distance between the two is ensured.

In addition, the plastic packaging material layer 51 may be selected from any one of the above mentioned material layers, or it may be a laminated material layer consisting of any two layers in the above-mentioned material layer, or a laminated material layer consisting of three layers, which may be selected according to actual needs, and of course, any material layer well known in the art may be selected, which is not limited to the above-mentioned material layers.

In an example, the rewiring layer 21 comprises: a dielectric layer 212, bonded onto the first surface 111 of the substrate 11; at least one metal wire layer 213, disposed inside the dielectric layer 212; and an under-bump metal layer 211, disposed on the dielectric layer 212, extending into the dielectric layer 212, and electrically connected to the metal wire layer 213, where the metal bump 31 is disposed on the under-bump metal layer 211.

Specifically, in an example, the rewiring layer 21 comprises a metal wire layer 213, a dielectric layer 212 and an under-bump metal layer 211. In an example, a process for manufacturing the under-bump metal layer comprises: first forming a metal wire layer on a surface of the substrate, and then forming a dielectric layer on the surface, where the dielectric layer wraps the metal wire layer. Alternatively, first forming a dielectric layer; then performing processes such as etching and filling; after that forming an opening in the dielectric layer, such that the under-bump metal layer can be prepared. Of course, the redistribution layer may be any redistribution layer structure commonly used in the art, or redistribution layer capable of realizing an electric connection leading-out function prepared by other processes.

In addition, in other examples, the dielectric layers may have two or more layers, and the metal wire layers may have two or more layers. For example, a first insulating layer is formed on the surface of the substrate; the metal wire layer is formed on the first insulating layer; a second insulating layer is formed on the top surface of the first insulating layer, and the second insulating layer covers the metal wire layer; an opening is formed in the second insulating layer and the opening exposes the metal wire layer; and the under-bump metal layer is formed in the opening.

Specifically, a material of the metal wire layer 213 may be, but not limited to, one of copper, aluminum, nickel, only, silver and titanium, or a laminated layer formed by more than two of the above material. A material of the dielectric layer 212 may be a low-k dielectric material, in particular, may comprise any one of an epoxy resin, a silica gel, PI (polyimide), PBO (Polybenzoxazole), BCB (Benzocyclobutene), a silica, phosphosilicate glass and fluorine-containing glass.

In an example, the metal bump 31 comprises: a copper column, a nickel layer disposed on a top surface of the copper column and a solder bump disposed on the nickel layer.

Specifically, the metal bump 31 may be a metal column, a solder ball, or a combination of a copper column and solder metal, etc. In this embodiment, a metal bump 31 is provided, and a preparation method comprises: manufacturing an under-bump metal layer on the rewiring layer; forming a copper column on a surface of the under-bump metal layer; forming a metal barrier layer on a surface of the copper column; and forming solder metal on a surface of the metal barrier layer, and forming a solder bump on the surface of the metal barrier layer by using a high-temperature reflow process.

Figure 7:
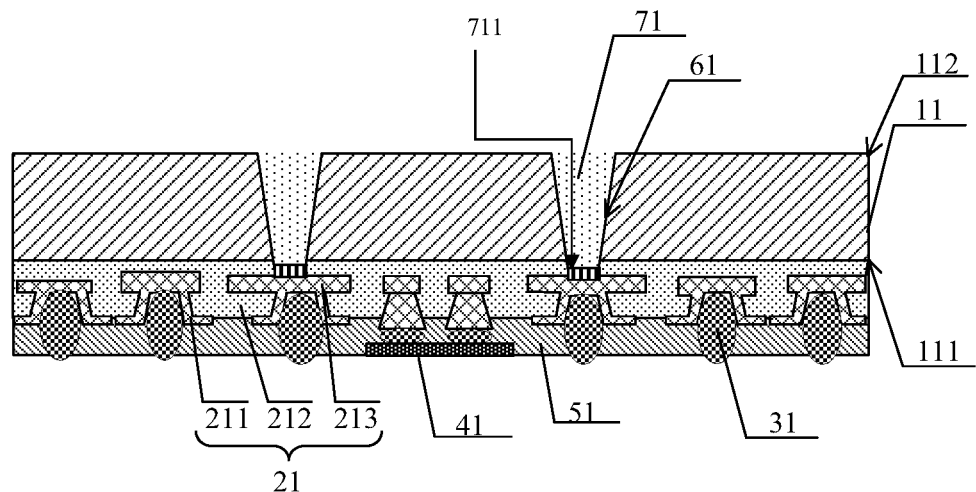
FIG. 7 is a cross sectional view of the semiconductor package structure after a conductive column is formed according to the present disclosure.

The metal barrier layer comprises a nickel layer 711 shown in FIG. 7, and a material of the solder bump comprises one of lead, tin and silver, or an alloy of the foregoing solder metal.

In an example, the antenna module comprises a plurality of antenna units 81, the antenna units 81 have a same shape, and a spacing is arranged between adjacent antenna units 81.

Specifically, the semiconductor package structure further comprises an antenna module, the antenna module is electrically connected to the rewiring layer on another surface of the substrate by using the conductive column, and then another electrical connection function is further performed, where a process for forming the antenna module may be any process well known by a person of ordinary skill in the art. For example, a dielectric layer of an antenna pattern having a window is first formed, where at least the conductive column is exposed from the window pattern, and then sputtering, electroplating and the like are performed to form a final antenna.

Specifically, the antenna module comprises at least one antenna unit 81, which may be block-shaped or spiral. Certainly, the number of the antenna units 81 may be multiple, such as 10 to 100, depending on an actual requirement. When the number of the antenna units is two or more, the shapes of different antenna units 81 may be the same or different. Additionally, when the antenna unit 81 is a block-shaped antenna, the block-shaped antenna may be a metal block; and when the antenna unit 81 is a spiral antenna, the spiral antenna may be formed by winding a metal wire into a spiral shape. Preferably, the antenna units have the same outer contour, such that uniform control can be realized which will facilitates reasonable layout according to actual needs.

In addition, a material of the antenna unit comprises, but is not limited to, any of copper, aluminum, nickel, gold, silver, tin and titanium, or a laminated material layer consisting of two or more of the above-mentioned material layers, which may be prepared by using any of techniques like a physical vapor deposition process (PVD), a chemical vapor deposition process (CVD), sputtering, electroplating and chemical plating. Additionally, a material of the conductive column 71 is preferably the same as a material of the antenna module.

Specifically, the first surface of the substrate 11 may be spin-coated with a conductive adhesive by using a conductive adhesive printing process, so that the conductive adhesive enters the via hole 61 to form the conductive column 71. Certainly, in another example, a conductive material (for example, metal, metal compound and the like) may alternatively be deposited in the via hole 61 by using a process such as a physical vapor deposition process, a chemical vapor deposition process (CVD), or plasma-enhanced CVD to form the conductive column 71. Preferably, a top surface of the conductive column 71 is leveled with the first surface of the substrate 11.

In an example, the antenna unit 81 comprises a central portion 811 and a peripheral portion 812 surrounding the central portion 811, and a spacing is arranged between the peripheral portion 812 and the central portion 811, where the central portion 811 is electrically connected to the metal bump 31 sequentially through the conductive column 71 and the rewiring layer 21.

In an example, the shape of an outer edge of the central portion 811 comprises a circle, the shape of an outer edge of the peripheral portion 812 comprises a square, and the shape of an inner circumvent of the peripheral portion 812 close to the central portion 811 is a circle.

Specifically, in this example, each of the antenna units is a planar inverted F-shaped antenna (PIFA). The antenna unit 81 is formed by two parts, comprising a central portion and a peripheral portion surrounding the central portion. The central portion 811 is directly electrically connected to the conductive column 71, and a spacing between the peripheral portion 812 and the central portion 811 is shown as D in FIG. 9, the spacing ranges from 10 µm to 200 µm, or in another range, and in this example, the spacing preferably ranges from 80 µm to 150 µm, so as to form an optimal configuration. Additionally, two antenna units 81 are preferably disposed around the semiconductor chip.

In an example, the antenna units 81 are arranged on the second surface 112 of the substrate 11 in an array, or in a ring shape or in an irregularly spaced pattern.

Specifically, the antenna units are evenly arranged, and a gap is arranged between the antenna units 81. The process for this design method is simple, the antenna units with the same outer contour do not need any other additional processes, it is suitable for mass production, the antenna signal is uniform and the loss is small. In addition, the gap between adjacent antenna units is arranged according to actual conditions. For example, in the plane where the surface of the substrate is disposed, the distance between the centers of adjacent antenna units may be arbitrarily set along the longitudinal direction or the horizontal direction perpendicular thereto, and the size of each antenna unit may be arbitrarily selected. Certainly, an arrangement manner of the antenna units may be set at will according to a requirement, antenna units having a large density may be set at required locations, or the antenna units may be arranged irregularly, which is not specifically limited herein.

In an example, the antenna module comprises at least two layers of antenna module unit, and each layer of the antenna module unit comprises at least one antenna unit 81.

Specifically, the antenna module 61 may be formed by a plurality of antenna units 611 arranged in a single layer on the second surface 112 of the substrate 11, or, arranged in a plurality of layers, which comprises two or more antenna unit layers, and then, design of antenna units in a reasonable number and shape is performed on each antenna unit layer, wherein adjacent two antenna unit layers are separated by a dielectric layer, and the electric connection between the different layers is realized by a conductive plug formed in the dielectric layer, such that flexible antenna layout design can be performed according to the specific needs.

Figure 2:
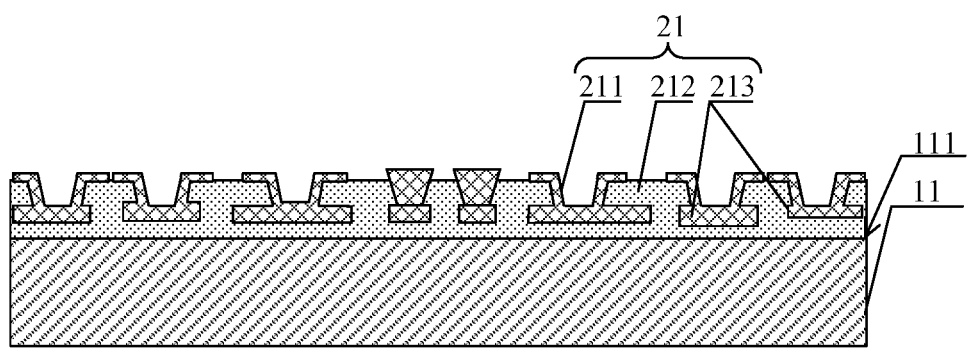
FIG. 2 is a cross sectional view of the semiconductor package structure after rewiring is formed according to the present disclosure.
Figure 3:
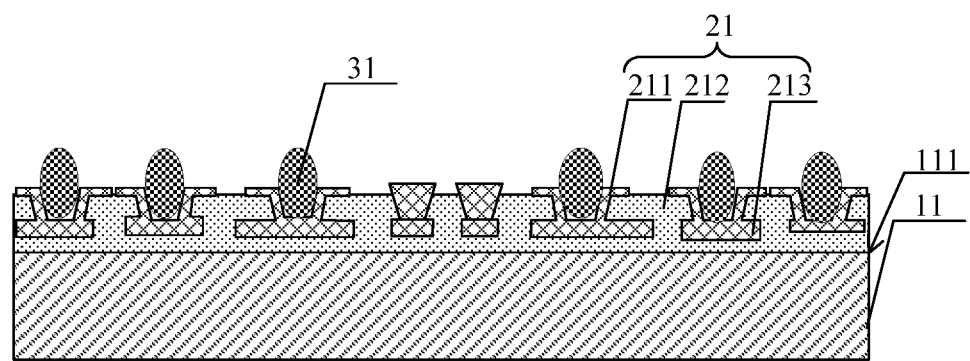
FIG. 3 is a cross sectional view of the semiconductor package structure after a metal bump is formed according to the present disclosure.
Figure 4:
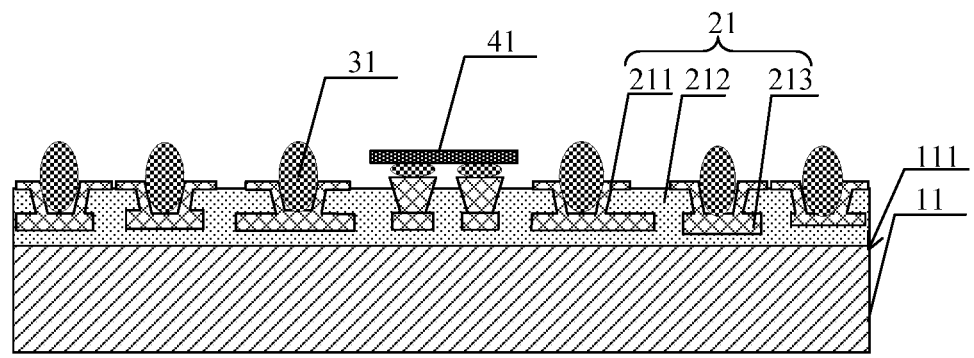
FIG. 4 is a cross sectional view of the semiconductor package structure after a semiconductor chip is formed according to the present disclosure.
Figure 5:
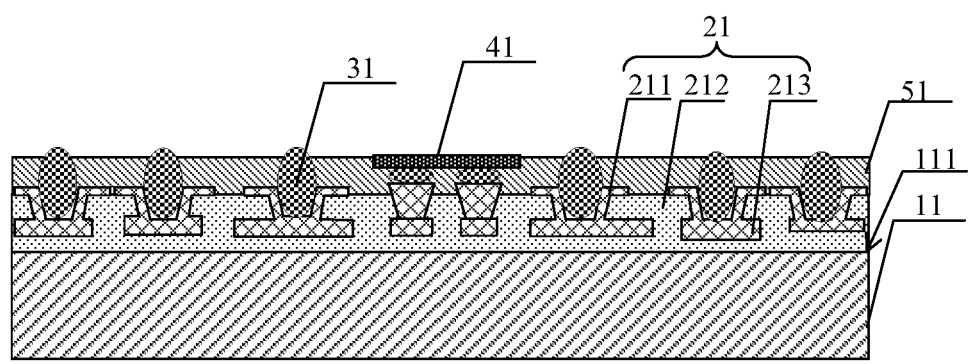
FIG. 5 is a cross sectional view of the semiconductor package structure after a plastic packaging material layer is formed according to the present disclosure.
Figure 6:
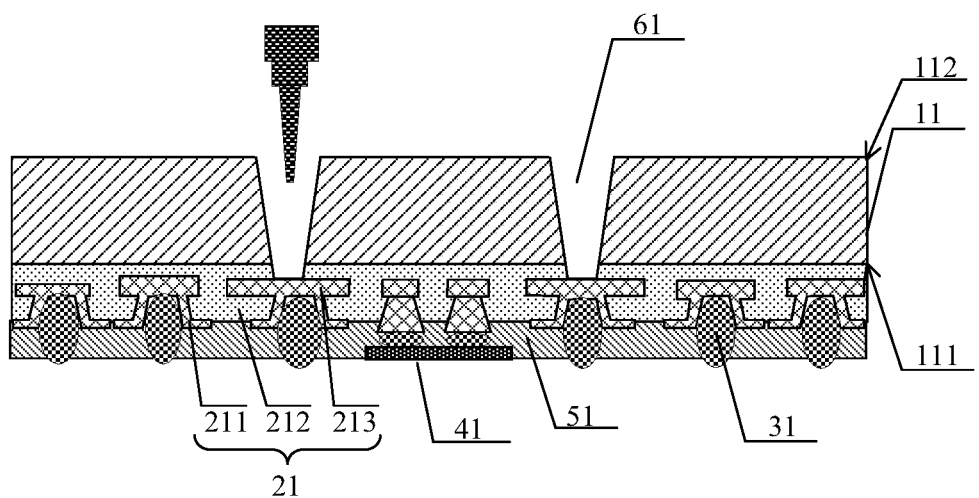
FIG. 6 is a cross sectional view of the semiconductor package structure after a via hole is formed according to the present disclosure.
Figure 8:
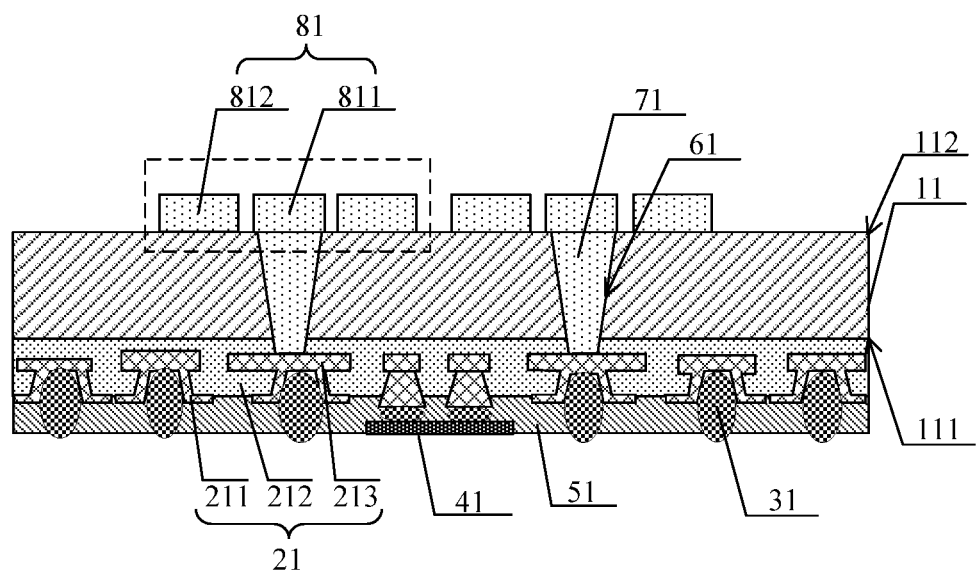
FIG. 8 is a cross sectional view of the semiconductor package structure after an antenna module is formed according to the present disclosure.
Figure 9:
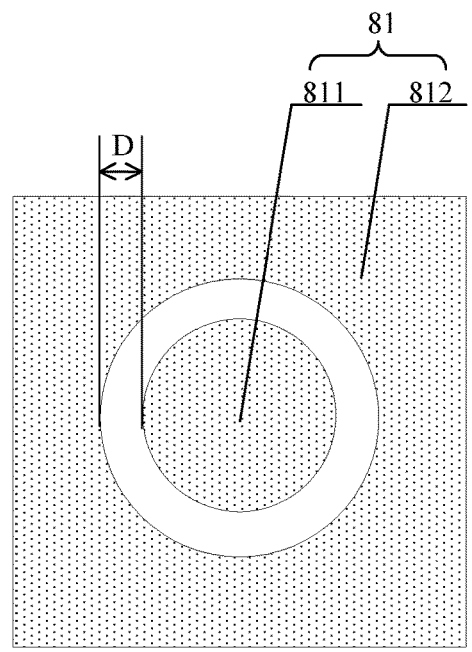
FIG. 9 is a top view of the antenna module in a dashed-lined box in FIG. 8.
Figure 10:
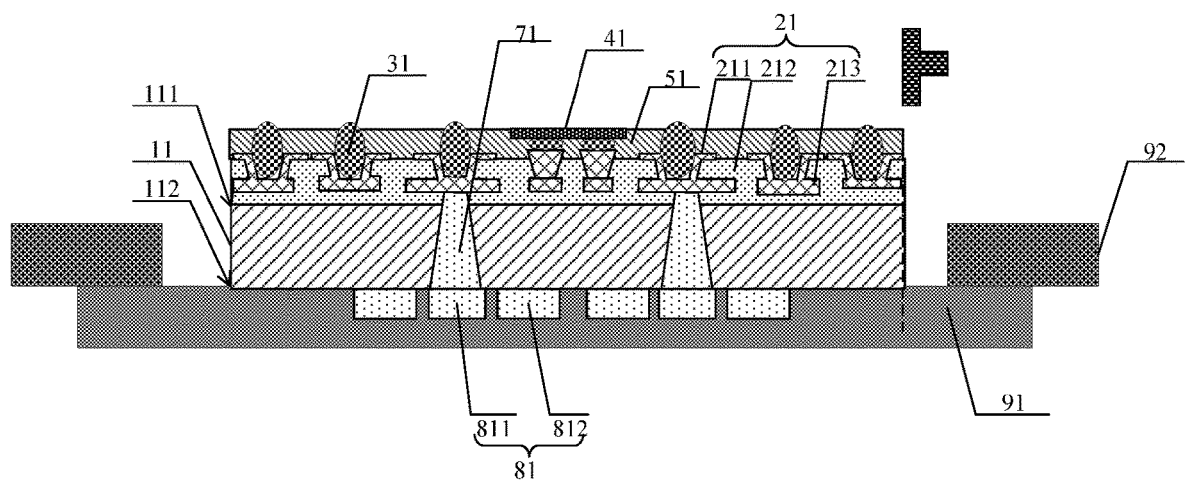
FIG. 10 is a cross sectional view of the finished semiconductor package structure according to the present disclosure.

Additionally, this application further provides a method for preparing the foregoing semiconductor package structure having an antenna module. FIG. 1 shows a substrate 11. FIG. 2 shows a structure after a rewiring layer 21 (top side RDL) is prepared. Then, as shown in FIG. 3, a metal bump 31 (ball mount) is prepared. Then, a process (die bonder) of bonding a semiconductor chip 41 shown in FIG. 4 is performed. Then, a plastic packaging material layer 51 (molding) is formed, as shown in FIG. 5. Then, a via hole 61 (backside laser drill) is prepared, as shown in FIG. 6. Then, a conductive column 71 (metal glue printer) is formed by means of deposition, as shown in FIG. 7. Then, an antenna module (antenna layer) is prepared, as shown in FIG. 8 and FIG. 9. As shown in FIG. 10, the method further comprises a step of wafer sawing (wafer mount & dicing saw or laser saw), where in a sawing process, a bonding layer and a fixing ring are further comprised, thereby obtaining the semiconductor package of the present disclosure.

To sum up, in the present disclosure, the semiconductor package structure having an antenna module comprises: a substrate, having a first surface and a second surface opposite to the first surface, where at least one via hole running through the first surface and the second surface is formed in the substrate; a rewiring layer, disposed on the first surface of the substrate; a metal bump, disposed on and electrically connected to the rewiring layer; a semiconductor chip, disposed on and electrically connected to the rewiring layer, where a spacing is arranged between the semiconductor chip and the metal bump; a conductive column, filling the via hole, and running through the substrate vertically; a plastic packaging material layer, disposed on the rewiring layer, surrounding the metal bump and the semiconductor chip, and exposing a part of the metal bump and a part of the semiconductor chip; and an antenna module, disposed on the second surface of the substrate, wherein the antenna module is electrically connected to the metal bump sequentially through the conductive column and the rewiring layer. By using the foregoing solution, the plastic packaging material layer wraps the semiconductor chip, to ensure stability of the semiconductor chip in a packaging process, and both the semiconductor chip and the metal bump are plastically packaged, to ensure that an offset between components does not occur easily, thereby further improving the packaging efficiency and a yield. By disposing the antenna module and the rewiring layer on two opposite surfaces of the substrate, and based on characteristic design of an electrical connection between the antenna module and the semiconductor chip by using the conductive column in the substrate, the rewiring layer and the metal bump, the semiconductor structure having an antenna module of the present disclosure may therefore facilitate proper packaging layout design. In the present disclosure, quartz glass or the like is selected as the substrate, the heat conductivity of quartz is (µ3-6) about ten times better than that of the packaging material (µ0.3-0.5), and therefore the problem of heat effect is solved. Moreover, since quartz sheet has no warping problem, the chip is further prevented from being easily warped and broken in the subsequent process, the manufacturing is facilitated, and the yield is improved. The structure of the present disclosure is simple and convenient, has low costs, and is suitable for mass production. Therefore, the present disclosure effectively overcomes various disadvantages in the prior art and has a high industrial utilization value.

The foregoing embodiments are merely intended to exemplarily describe the principles and efficacy of the present disclosure and are not intended to limit the present disclosure. A person skilled in the art can make modifications or changes to the foregoing embodiments without departing from the spirit and scope of the present disclosure. Therefore, any equivalent modifications or changes completed by a person of common knowledge in the art without departing from the spirit and technical thoughts disclosed in the present disclosure shall still fall within the scope of the claims of the present disclosure.

The invention claimed is:

1. A semiconductor package structure having an antenna module, comprising:
    a substrate, having a first surface and a second surface opposite to the first surface, wherein at least one via hole is formed through the substrate from the first surface to the second surface;
    a rewiring layer, disposed on the first surface of the substrate;
    a metal bump, disposed on and electrically connected to the rewiring layer;
    a semiconductor chip, disposed on and electrically connected to the rewiring layer, wherein a space is arranged between the semiconductor chip and the metal bump;
    a conductive column, filling the via hole;
    a plastic packaging material layer, disposed on the rewiring layer, embedding the metal bump and the semiconductor chip except leaving a top part of the metal bump and a top part of the semiconductor chip exposed; and
    an antenna module, disposed on the second surface of the substrate, wherein the antenna module is electrically connected to the metal bump through the conductive column and the rewiring layer;
    wherein the antenna module comprises a plurality of antenna units, each arranged to have a space from another antenna unit of the plurality of antenna units and each having a same shape;
    wherein the plurality of antenna units comprises a central portion and a peripheral portion surrounding the central portion, and wherein a gap is arranged between the peripheral portion and the central portion; and
    wherein the central portion is electrically connected to the metal bump through the conductive column and the rewiring layer.

2. The semiconductor package structure having an antenna module according to claim 1, wherein the plastic packaging material layer comprises one of a polyimide layer, a silica gel layer and an epoxy resin layer.

3. The semiconductor package structure having an antenna module according to claim 1, wherein the substrate is a quartz glass substrate or a sapphire substrate.

4. The semiconductor package structure having an antenna module according to claim 1, wherein the rewiring layer comprises:
    a dielectric layer, bonded onto the first surface of the substrate;
    one metal wire layer, wherein the metal wire layer is patterned inside the dielectric layer; and
    an under-bump metal layer, patterned on the dielectric layer to electrically connect to the metal wire layer, wherein the metal bump is disposed on the under-bump metal layer.

5. The semiconductor package structure having an antenna module according to claim 1, wherein the metal bump comprises: a copper column, a nickel layer disposed on a top surface of the copper column and a solder bump disposed under the nickel layer.

6. The semiconductor package structure having an antenna module according to claim 1, wherein an outer circumvent of the central portion is a circle, an outer circumvent of the peripheral portion is a square, and an inner circumvent of the peripheral portion close to the central portion is a circle.

7. The semiconductor package structure having an antenna module according to claim 1, wherein the plurality of antenna units is arranged in an array, or in a ring on the second surface of the substrate.

8. The semiconductor package structure having an antenna module according to claim 1, wherein the plurality of antenna units is arranged unevenly spaced on the second surface of the substrate.

9. The semiconductor package structure having an antenna module according to claim 1, wherein the antenna module comprises at least two layers of antenna module units, and each layer of the antenna module units comprises at least one antenna unit.

* * * * *